US012787423B2

(12) United States Patent
Guler et al.

(10) Patent No.: US 12,787,423 B2
(45) Date of Patent: Nov. 3, 2026

(54) PLUG BETWEEN TWO GATES OF A SEMICONDUCTOR DEVICE

(71) Applicant: Intel Corporation, Santa Clara, CA (US)

(72) Inventors: Leonard P. Guler, Hillsboro, OR (US); Robert Joachim, Beaverton, OR (US); Shengsi Liu, Portland, OR (US); Hongqian Sun, Sammamish, WA (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 209 days.

(21) Appl. No.: 17/958,291

(22) Filed: Sep. 30, 2022

(65) Prior Publication Data

US 2024/0113109 A1 Apr. 4, 2024

(51) Int. Cl.

| | |
|---|---|
| ***H10D 84/83*** | (2025.01) |
| ***H10D 84/01*** | (2025.01) |
| ***H10D 84/03*** | (2025.01) |
| ***H10W 42/00*** | (2026.01) |

(52) U.S. Cl.

CPC ......... *H10D 84/83* (2025.01); *H10D 84/0126* (2025.01); *H10D 84/038* (2025.01); *H10W 42/00* (2026.01)

(58) Field of Classification Search

CPC ...... H10B 63/24; H10B 63/84; H10N 70/021; H10N 70/063; H10N 70/841; H10N 70/8828

See application file for complete search history.

(56) References Cited

U.S. PATENT DOCUMENTS 12,266,703 B2 * 4/2025 Lin ...................... H10D 30/024

* cited by examiner

*Primary Examiner* — Mark V Prenty

(74) *Attorney, Agent, or Firm* — Schwabe, Williamson & Wyatt, P.C.

(57) ABSTRACT

Embodiments described herein may be related to apparatuses, processes, systems, and/or techniques for forming a plug between two gates within a transistor layer of a semiconductor device. In embodiments, the plug includes a cap at a top of the plug and a liner surrounding at least a portion of the cap, and a base below the cap and the liner. The cap may include a metal. A top of the cap may be even with, or substantially even with, the top of the two gates. The plug may provide a more even surface at a top of a transistor layer where the plug fills in for a gate cut. Other embodiments may be described and/or claimed.

24 Claims, 9 Drawing Sheets

PLUG BETWEEN TWO GATES OF A SEMICONDUCTOR DEVICE

FIELD

Embodiments of the present disclosure generally relate to the field of semiconductor manufacturing, and in particular to manufacturing transistor structures within a semiconductor.

BACKGROUND

Continued growth in virtual machines, cloud computing, and portable devices will continue to increase the demand for high density transistors within chips and packages. In addition, there will be an increased need for high quality transistor structures within these chips and packages.

DETAILED DESCRIPTION

Figure 1:
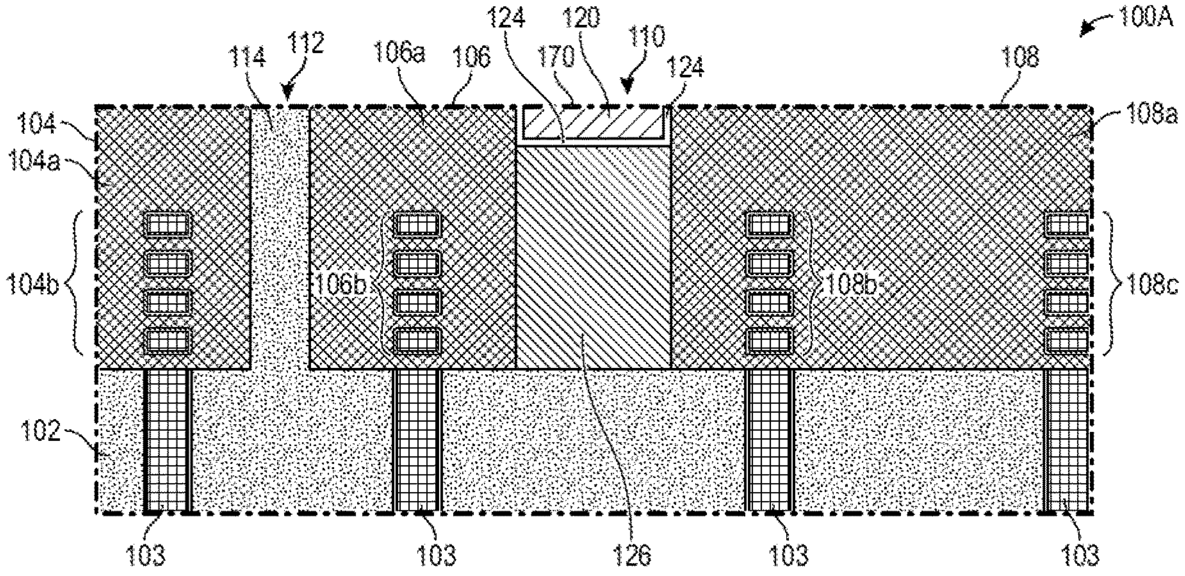
FIG. 1 illustrates a cross section side view of a plug that separates two gates, in accordance with various embodiments.
Figure 1:
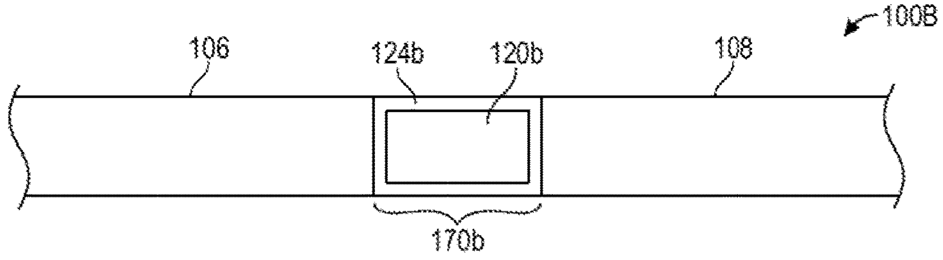
Figure 1:
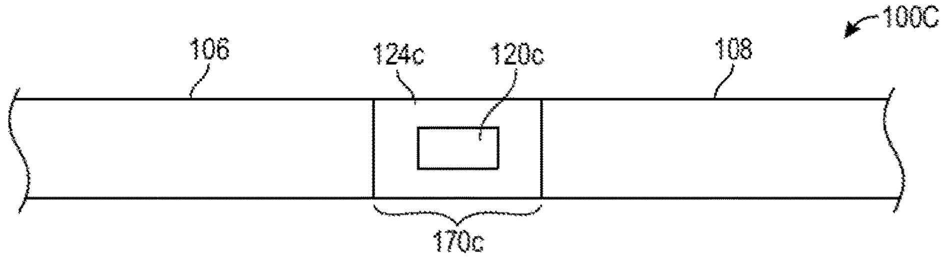

Embodiments described herein may be related to apparatuses, processes, systems, and/or techniques for placing a plug between two gates within a transistor layer of a semiconductor device. In embodiments, the two gates, which may be metal gates, may be substantially in a same plane, but separated by a gap. The gap may then be filled with a plug that includes a cap, a liner around at least a portion of the cap, and a base below the cap and the liner. The base may include a dielectric material. In embodiments, the cap may be at the top of the plug. In embodiments, a top of the cap may be even with, or substantially even with, the top of the two gates, thus the top of the cap and the top of the two gates may be substantially in a same plane.

In embodiments, the plug may be used to provide a more even or level surface at a top of a transistor layer where one or more cuts into the gates may otherwise cause the surface at the top of the transistor layer to be uneven during subsequent etching. In embodiments the cuts into the gates may include traditional gate cuts or fin trench isolation cuts. In embodiments, the cap may be at least partially surrounded by a liner, which may electrically and physically isolate the cap from the gates. In embodiments, the cap may be a metal cap.

In embodiments, during an etch process that may be applied to a top surface of the transistor layer, the top of the cap, along with the liner at least partially surrounding the cap, will remain and not be etched. As a result, the space between the two gates and will not be etched down during the etch process, and an even surface at the top of the transistor layer may be maintained. A subsequent etch may be performed to remove the liner, thus exposing at least part of the sides of the cap.

In embodiments, the plug may be used in a number of different types of semiconductor devices. These devices may include one or more finFET, a gate-all-around (GAA) FET, or a forkFET transistor structures.

In legacy implementations, a dielectric may be used to fill in between two gates. However, in subsequent processing, an etching process may etch down the dielectric and leave a hole between the two gates, thus forming an uneven surface of the top of the transistor layer. This uneven surface may cause difficulties for subsequent stages in the legacy manufacturing process.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase “A and/or B” means (A), (B), or (A and B). For the purposes of the present disclosure, the phrase “A, B, and/or C” means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases “in an embodiment,” or “in embodiments,” which may each refer to one or more of the same or different embodiments. Furthermore, the terms “comprising,” “including,” “having,” and the like, as used with respect to embodiments of the present disclosure, are synonymous.

The term “coupled with,” along with its derivatives, may be used herein. “Coupled” may mean one or more of the following. “Coupled” may mean that two or more elements are in direct physical or electrical contact. However, “coupled” may also mean that two or more elements indirectly contact each other, but yet still cooperate or interact with each other, and may mean that one or more other elements are coupled or connected between the elements that are said to be coupled with each other. The term “directly coupled” may mean that two or more elements are in direct contact.

Various operations may be described as multiple discrete operations in turn, in a manner that is most helpful in understanding the claimed subject matter. However, the order of description should not be construed as to imply that these operations are necessarily order dependent.

As used herein, the term “module” may refer to, be part of, or include an ASIC, an electronic circuit, a processor (shared, dedicated, or group) and/or memory (shared, dedicated, or group) that execute one or more software or firmware programs, a combinational logic circuit, and/or other suitable components that provide the described functionality.

Various Figures herein may depict one or more layers of one or more package assemblies. The layers depicted herein are depicted as examples of relative positions of the layers of the different package assemblies. The layers are depicted for the purposes of explanation, and are not drawn to scale. Therefore, comparative sizes of layers should not be assumed from the Figures, and sizes, thicknesses, or dimensions may be assumed for some embodiments only where specifically indicated or discussed.

Various embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

FIG. 1 illustrates a cross section side view of a plug that separates two gates, in accordance with various embodiments. Semiconductor device 100A is a cross section side view through a first gate 104, a second gate 106, and a third gate 108. Semiconductor device 100A includes a substrate 102 with a first gate 104 including a first gate metal 104*a*, a second gate 106 including a second gate metal 106*a*, and the third gate 108 including a third gate metal 108*a* on the substrate 102.

In embodiments, nanoribbons 104*b* may extend through the first gate metal 104*a*, nanoribbons 106*b* may extend through the second gate metal 106*a*, and nanoribbons 108*b*, 108*c* may extend through the third gate metal 108*a*. In embodiments, a plurality of sub-ribbons 103 may be in the substrate 102 and may be below, respectively, nanoribbons 104*b*, 106*b*, 108*b*, 108*c*.

In embodiments, a first gate cut 110 has been made to electrically isolate the second gate metal 106*a* and the third gate metal 108*a*. A second gate cut 112 has been made to electrically isolate the first gate metal 104*a* from the second gate metal 106*a*. The second gate cut 112 is filled with a filler 114, which may include a dielectric.

In embodiments, the first gate cut 110 may include a plug 170. The plug 170 may include a cap 120 that may be surrounded by a liner 124. In embodiments, the plug 170 may also include a base 126 below the cap 120. In embodiments, the base 126 may extend to the substrate 102. The base 126 may include a dielectric material that may include hafnium, oxygen, titanium, aluminum, HfO, TiO, and/or $Al_2O$. In embodiments, the liner 124 may be between the cap 120, the base 126, the second gate 106 and the third gate 108. In embodiments where there is no liner 124, the base 126 may directly couple with the cap 120.

In embodiments, the cap 120 may be a hard material, and may include tungsten (W), aluminum oxide (AlO), and/or hafnium oxide (HfO). In embodiments some other type of material may be used. In embodiments where there is no liner 124, the cap 120 may include a material that includes a metal. In embodiments, the liner 124 may include silicon, nitrogen, oxygen, silicon dioxide ($SiO_2$), and/or silicon nitride (SiN). In embodiments, the plug 170 may not include the base 126.

Diagram 100B shows a top-down view of an embodiment of a portion of semiconductor device 100A with a top of the second gate 106 and a top of the third gate 108 that has a plug 170*b*, which may be similar to plug 170, that includes a cap 120*b*, which may be similar to cap 120, that is surrounded by a liner 124*b*, which may be similar to liner 124. The plug 170*b* separates the second gate 106 and the third gate 108.

Diagram 100C shows a top-down view of another embodiment of semiconductor device with a top of the second gate 106 and a top of the third gate 108 that has a plug 170*c*, which may be similar to plug 170, that includes a cap 120*c*, which may be similar to cap 120, that is surrounded by the liner 124*c*, which may be similar to liner 124. The plug 170*c* separates the second gate 106 and the third gate 108.

In diagram 100B, the sides of the liner 124*b* are thinner, resulting in a larger cap 120*b* as compared to diagram 100C, where the sides of the liner 124*c* are thicker, resulting in a smaller cap 120*c*. In embodiments, the liner 124*b* together with the cap 120*b* may be used to adjust a dimension of the plug 170*b*.

Figure 2A:
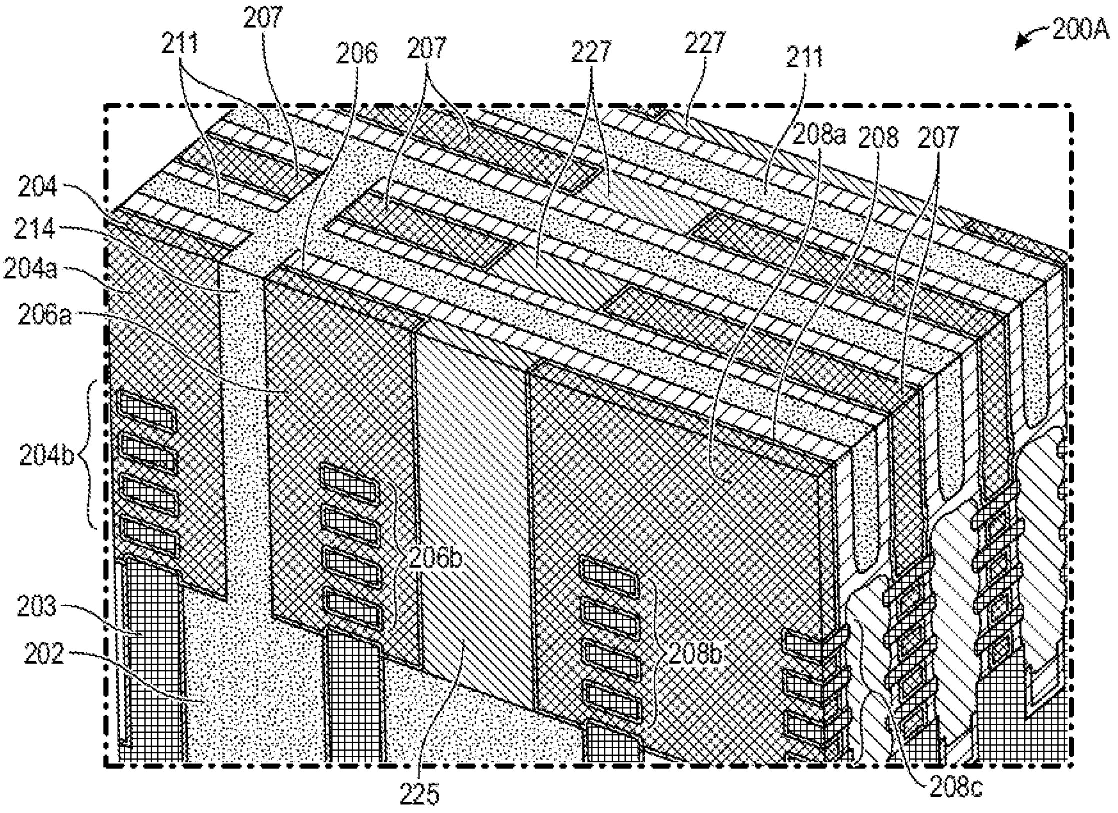
FIGS. 2A-2E illustrate cross section perspective views of stages in a manufacturing process for creating plugs between two gates of a semiconductor device, in accordance with various embodiments.

FIGS. 2A-2E illustrate cross section perspective views of stages in a manufacturing process for creating plugs between two gates of a semiconductor device, in accordance with various embodiments. FIG. 2A shows a cross section perspective view of a semiconductor device 200A, which may be similar to semiconductor device 100A of FIG. 1, that includes a substrate 202 with a first gate 204 that includes a first gate metal 204*a*, a second gate 206 that includes a second gate metal 206*a*, and the third gate 208 that includes a third gate metal 208*a* on the substrate 202.

In embodiments, nanoribbons 204*b* may extend through the first gate metal 204*a*, nanoribbons 206*b* may extend through the second gate metal 206*a*, and nanoribbons 208*b*, 208*c* may extend through the third gate metal 208*a*. In embodiments, a plurality sub-ribbons 203 may be in the substrate 202 and may be below, respectively, nanoribbons 204*b*, 206*b*, 208*b*, 208*c*. Other gates 207 may be placed in different locations within the semiconductor device 200A. In embodiments, the other gates 207 may be separated from each other with layers 211. In embodiments layers 211 may include a dielectric, and may be referred to as a source/drain sacrificial dielectric.

In embodiments a filler material 214, which may be similar to filler 114, may be placed within second gate cut 112 of FIG. 1, and may electrically isolate the first gate 204 and the second gate 206 from each other. In embodiments, the filler material 214 may include a dielectric. In embodiments, a filler 225, which may be similar to the base 126 of FIG. 1, may be placed on the substrate 202 and between the second gate 206 and the third gate 208 to electrically isolate the second gate 206 and the third gate 208 from each other. In embodiments, filler 227, which may include material that is similar to the material in filler 225, may be in different locations within the semiconductor device 200A.

Figure 2B:
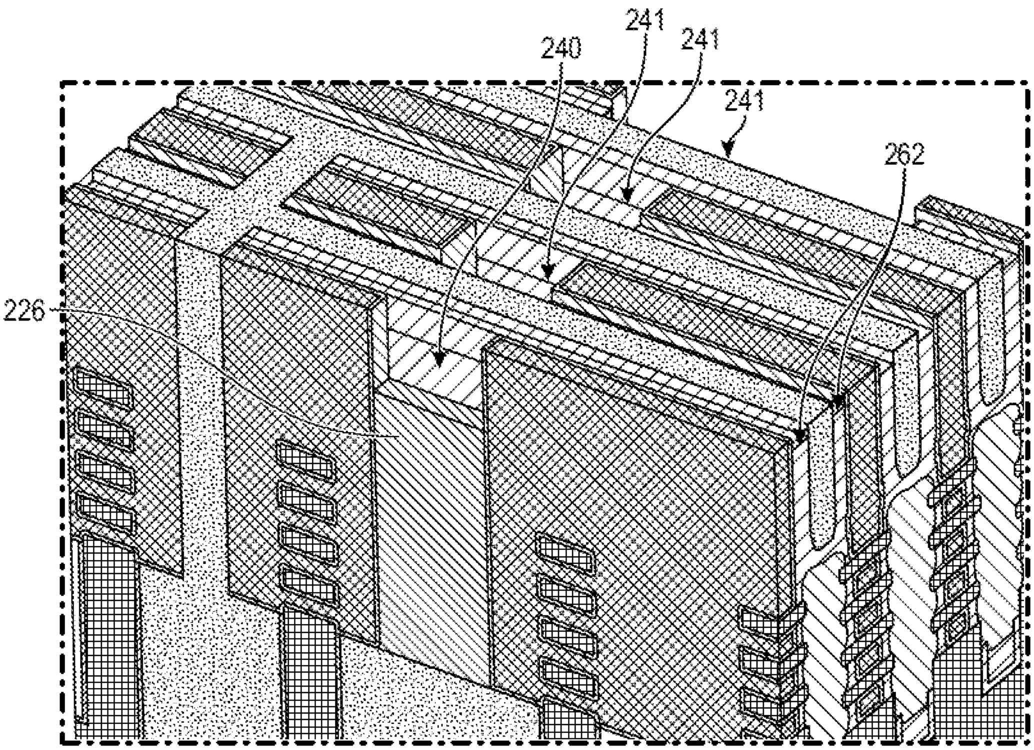

FIG. 2B illustrates a cross section perspective view of a stage in the manufacturing process where an etch process may be applied to create a cavity 240 by etching out a portion of filler 225 of FIG. 2A to create base 226, which may be similar to base 126 of FIG. 1. In embodiments, a selected etch may be used to create a cavity 240 selected to layers 211. Other cavities 241, which may be similar to cavity 240, may also be formed by the etch process where portions of the filler 227 of FIG. 2A are removed. In embodiments, the etch process may also create etches 262 on either side of the first gate 204, the second gate 206, and the third gate 208.

Figure 2C:
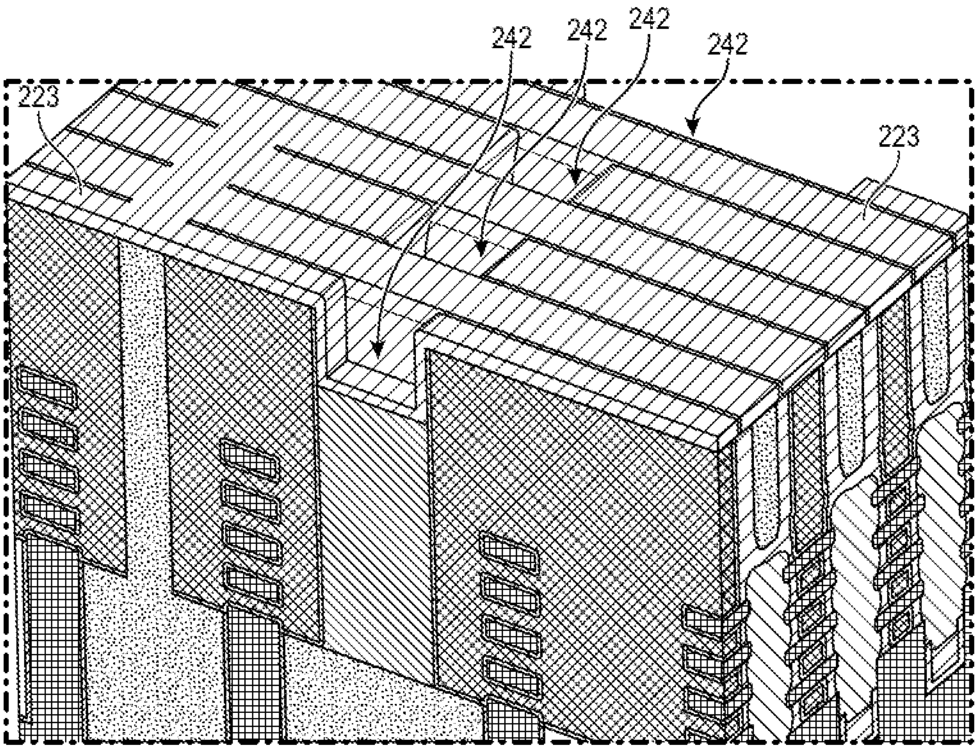

FIG. 2C illustrates a cross section perspective view of a stage in the manufacturing process where a liner layer 223, which may be similar to liner 124 of FIG. 1, is applied. In embodiments, the liner layer 223 may be applied using an atomic layer deposition (ALD) process. In some embodiments, a thickness of the liner layer 223 may range from 1 to 5 nm. In embodiments, a thinner liner layer 223 may be applied, which may result in a liner with a shape similar to liner 124*b* of diagram 100B of FIG. 1. In embodiments, a thicker liner layer 223 may be applied, which may result in a liner with a shape similar to liner 124*c* of diagram 100C of FIG. 1. After the liner layer 223 is applied and cured, cavities 242 may result.

Figure 2D:
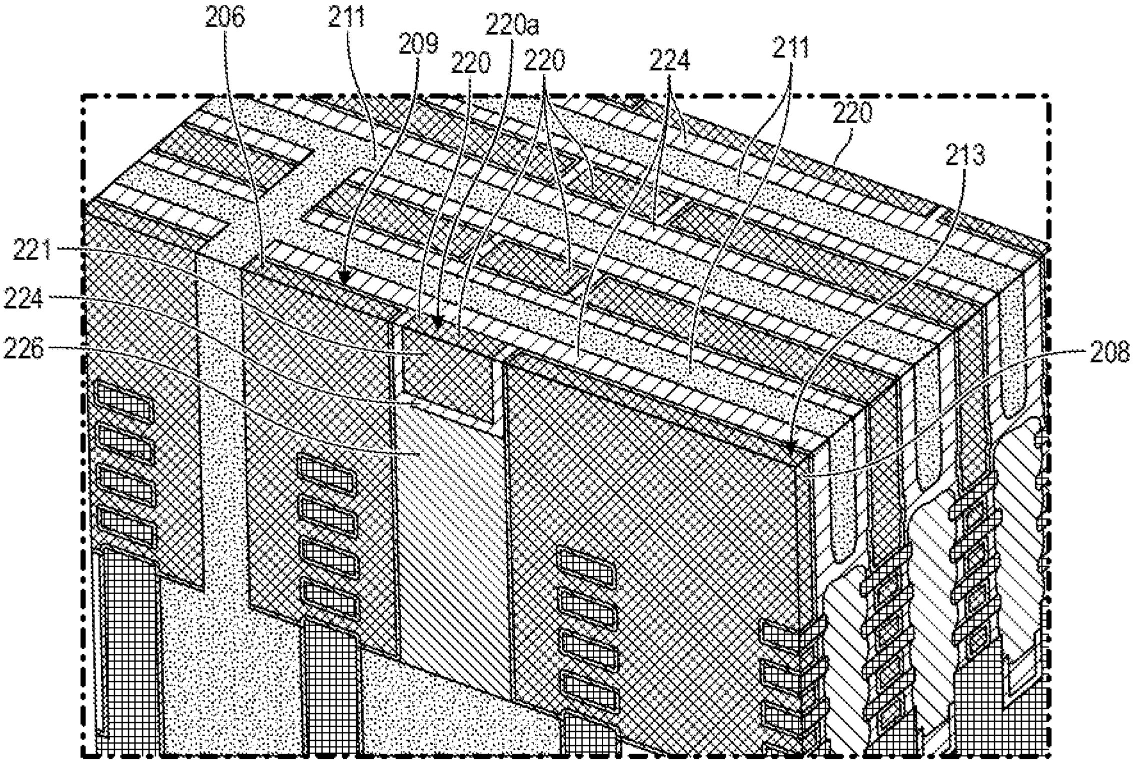

FIG. 2D illustrates a cross section perspective view of a stage in the manufacturing process where a cap material 221 is deposited on the surface of the liner layer 223 of FIG. 2C and into the cavities 240, 242. In embodiments, the cap material 221, which may be similar to cap 120 of FIG. 1, may include a hard material, and may include W, AlO, or HfO. After the deposition of the cap material 221, a polish process may then be performed to reveal caps 220, and liner 224 above base 226, which may be similar to cap 120 and liner 124 of FIG. 1.

In embodiments, a dimension of the caps 220 will be based on the thickness of the liner layer 223 of FIG. 2C. In embodiments, the liner 224 may completely surround the cap 220. In embodiments, the liner 224 may extend to the layers 211. It should be appreciated that in embodiments this process results in a top surface 220*a* of the cap 220, a top surface 209 of the second gate 206, and a top surface 213 of the third gate 208 being in a same plane.

Figure 2E:
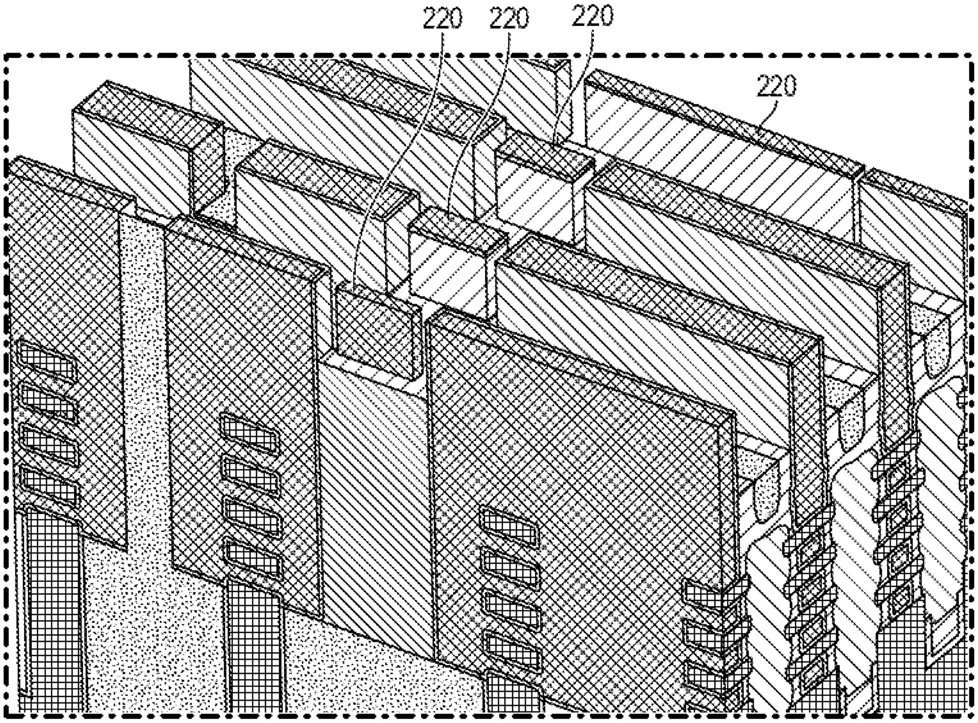

FIG. 2E illustrates a cross section perspective view of a stage in the manufacturing process where an etch process is performed to etch the liner 224 of FIG. 2D, exposing the caps 220.

Figure 3:
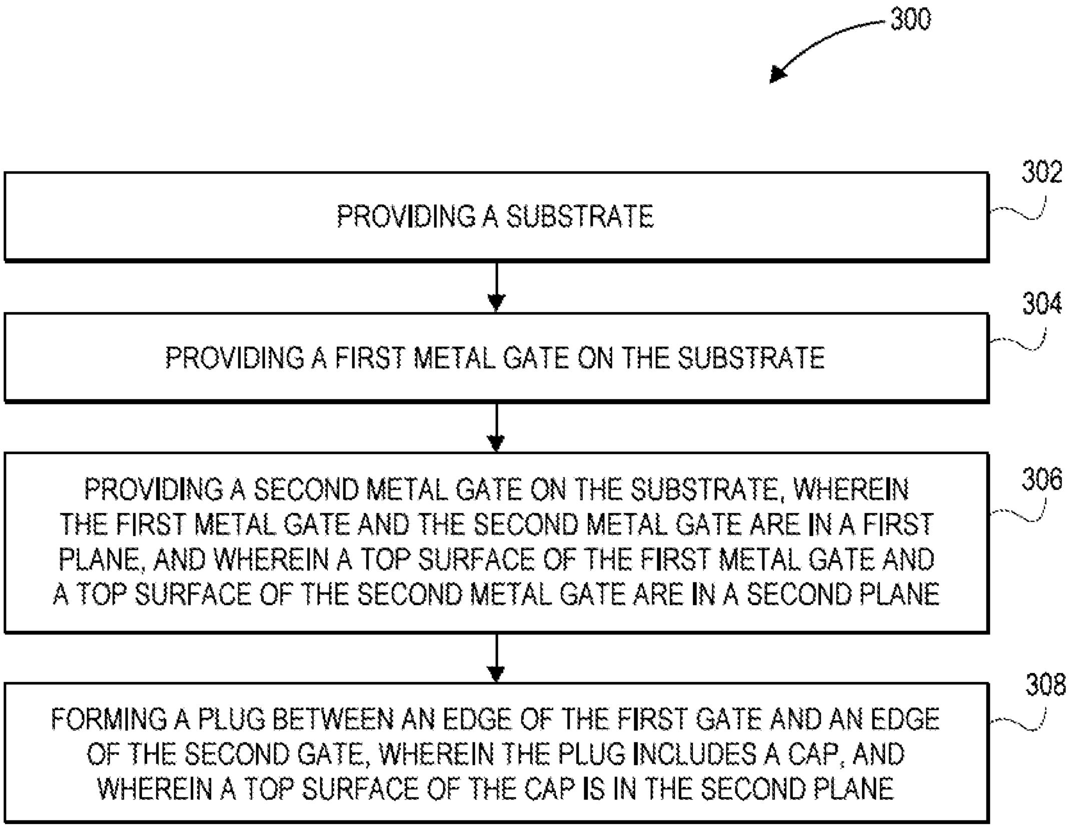
FIG. 3 illustrates an example process for manufacturing a semiconductor device that includes a plug between two gates, in accordance with various embodiments.

FIG. 3 illustrates an example process for manufacturing a semiconductor device that includes a plug between two gates, in accordance with various embodiments. Process 300 may be performed using the apparatus, systems, processes, and/or techniques described herein, and in particular with respect to FIGS. 1-2E.

At block 302, the process may include providing a substrate. In embodiments, the substrate may be similar to substrate 102 of FIG. 1, or to substrate 202 of FIG. 2A.

At block 304, the process may further include providing a first metal gate on the substrate. In embodiments, the first metal gate may be similar to second gate 106 of FIG. 1, or to the second gate 206 of FIG. 2A.

At block 306, the process may further include providing a second metal gate on the substrate, wherein the first metal gate and the second metal gate are in a first plane, and wherein a top surface of the first metal gate and a top surface of the second metal gate are in a second plane. In embodiments, the second metal gate may be similar to third gate 108 of FIG. 1, or to the third gate 208 of FIG. 2A.

At block 308, the process may further include forming a plug between an edge of the first gate and an edge of the second gate, wherein the plug includes a cap, and wherein a top surface of the cap is in the second plane. In embodiments, the plug may be similar to plug 170, 170*b*, 170*c* of FIG. 1. In embodiments, the plug may be similar to plug 170 of FIG. 1. In embodiments, the cap may be similar to cap 120, 120*b*, 120*c* of FIG. 1, or cap 220 of FIG. 2D.

Implementations of embodiments of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the invention may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 4:
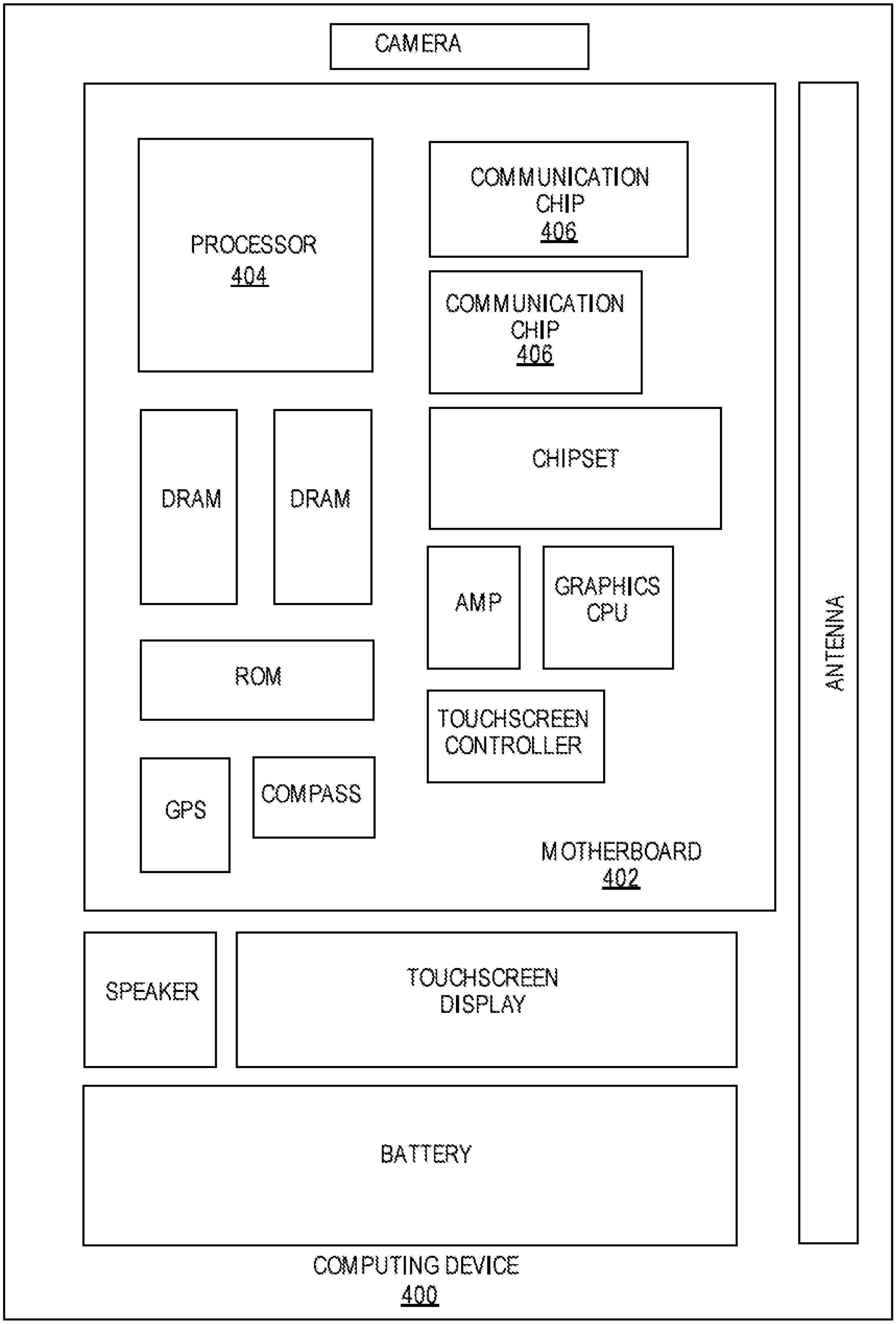
FIG. 4 illustrates a computing device in accordance with one implementation of the invention.

FIG. 4 illustrates a computing device 400 in accordance with one implementation of the invention. The computing device 400 houses a board 402. The board 402 may include a number of components, including but not limited to a processor 404 and at least one communication chip 406. The processor 404 is physically and electrically coupled to the board 402. In some implementations the at least one communication chip 406 is also physically and electrically coupled to the board 402. In further implementations, the communication chip 406 is part of the processor 404.

Depending on its applications, computing device 400 may include other components that may or may not be physically and electrically coupled to the board 402. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 406 enables wireless communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

The processor 404 of the computing device 400 includes an integrated circuit die packaged within the processor 404. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 406 also includes an integrated circuit die packaged within the communication chip 406. In accordance with another implementation of the invention, the integrated circuit die of the communication chip includes one or more devices, such as MOS-FET transistors built in accordance with implementations of the invention.

In further implementations, another component housed within the computing device 400 may contain an integrated circuit die that includes one or more devices, such as MOS-FET transistors built in accordance with implementations of the invention.

In various implementations, the computing device 400 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 400 may be any other electronic device that processes data.

Figure 5:
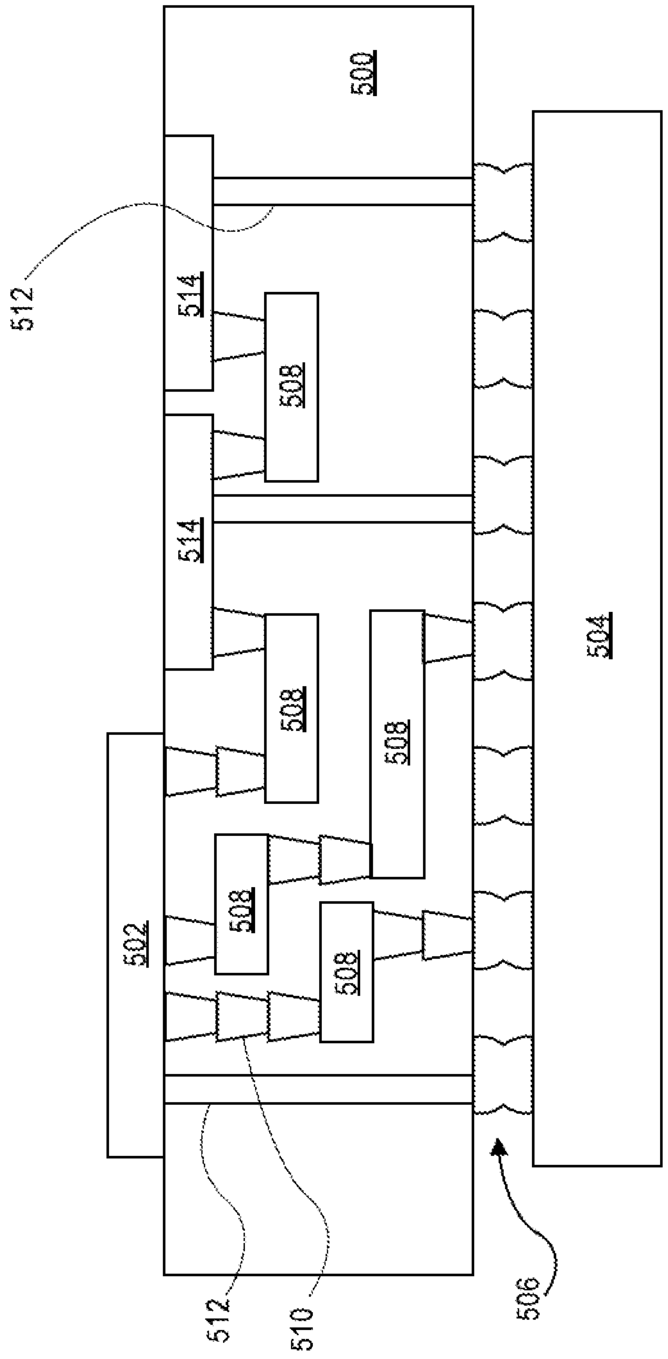
FIG. 5 illustrates an interposer that includes one or more embodiments of the invention.

FIG. 5 illustrates an interposer 500 that includes one or more embodiments of the invention. The interposer 500 is an intervening substrate used to bridge a first substrate 502 to a second substrate 504. The first substrate 502 may be, for instance, an integrated circuit die. The second substrate 504 may be, for instance, a memory module, a computer motherboard, or another integrated circuit die. Generally, the purpose of an interposer 500 is to spread a connection to a wider pitch or to reroute a connection to a different connection. For example, an interposer 500 may couple an integrated circuit die to a ball grid array (BGA) 506 that can subsequently be coupled to the second substrate 504. In some embodiments, the first and second substrates 502/504 are attached to opposing sides of the interposer 500. In other embodiments, the first and second substrates 502/504 are attached to the same side of the interposer 500. And in further embodiments, three or more substrates are interconnected by way of the interposer 500.

The interposer 500 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 508 and vias 510, including but not limited to through-silicon vias (TSVs) 512. The interposer 500 may further include embedded devices 514, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 500. In accordance with embodiments of the invention, apparatuses or processes disclosed herein may be used in the fabrication of interposer 500.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims.

Where the disclosure recites “a” or “a first” element or the equivalent thereof, such disclosure includes one or more such elements, neither requiring nor excluding two or more such elements. Further, ordinal indicators (e.g., first, second or third) for identified elements are used to distinguish between the elements, and do not indicate or imply a required or limited number of such elements, nor do they indicate a particular position or order of such elements unless otherwise specifically stated.

Various embodiments may include any suitable combination of the above-described embodiments including alternative (or) embodiments of embodiments that are described in conjunctive form (and) above (e.g., the “and” may be “and/or”). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the invention is to be determined entirely by the following claims, which are to be construed in accordance with established doctrines of claim interpretation.

The following paragraphs describe examples of various embodiments.

Examples

Example 1 is a semiconductor device comprising: a first gate with a top and a bottom; a second gate with a top and a bottom, wherein a top of the first gate and a top of the second gate are in a plane; and a plug between the first gate and the second gate, wherein the plug includes a cap and a liner that at least partially surrounds the cap, wherein the liner separates the cap from the first gate and from the second gate.

Example 2 includes the semiconductor device of example 1, wherein a top of the cap is in the plane.

Example 3 includes the semiconductor device of example 2, wherein the cap is electrically isolated from the first gate and from the second gate.

Example 4 includes the semiconductor device of examples 1, 2, or 3, wherein the cap includes tungsten.

Example 5 includes the semiconductor device of examples 1, 2, 3, or 4, wherein the liner includes a selected one or more of: silicon, oxygen, or nitrogen.

Example 6 includes the semiconductor device of examples 1, 2, 3, 4, or 5, wherein the plug further includes a base below the cap and the liner.

Example 7 includes the semiconductor device of example 6, wherein the base includes a dielectric.

Example 8 includes the semiconductor device of examples 1, 2, 3, 4, 5, 6, or 7, further including a first plurality of nanoribbons through the first gate and a second plurality of nanoribbons through the second gate.

Example 9 includes the semiconductor device of examples 1, 2, 3, 4, 5, 6, 7, or 8, wherein the plug is formed into a gate cut in the semiconductor device.

Example 10 includes the semiconductor device of examples 1, 2, 3, 4, 5, 6, 7, or 8, wherein the semiconductor device includes a selected one or more of: a finFET, a gate-all-around FET, or a forkFET.

Example 11 is a semiconductor device comprising: a substrate; a first gate on the substrate; second gate on the substrate, wherein a side of the first gate and a side of the second gate are in a first plane, and wherein a top of the first gate and a top of the second gate are in a second plane; and a plug between the first gate and the second gate, wherein a top of the plug is in the second plane.

Example 12 includes the semiconductor device of example 11, wherein a side of the plug is parallel to the first plane.

Example 13 includes the semiconductor device of examples 11 or 12, wherein the plug is on the substrate.

Example 14 includes the semiconductor device of examples 11, 12, or 13, wherein the plug further includes: a cap; and a liner at least partially surrounding the cap, wherein a top of the cap is in the second plane.

Example 15 includes the semiconductor device of example 14, wherein the plug further includes a base between the substrate and the liner.

Example 16 includes the semiconductor device of example 15, wherein the base includes a dielectric.

Example 17 includes the semiconductor device of examples 14, 15, or 16, wherein the cap includes a selected one or more of: tungsten, aluminum, oxygen, and/or hafnium.

Example 18 includes the semiconductor device of examples 14, 15, 16, or 17, wherein the cap is not electrically conductive.

Example 19 includes the semiconductor device of examples 14, 15, 16, 17, or 18, wherein the cap is electrically isolated from the first gate and from the second gate.

Example 20 includes the semiconductor device of examples 14, 15, 16, 17, 18, or 19, wherein the liner includes a selected one or more of: silicon, oxygen, or nitrogen.

Example 21 includes the semiconductor device of examples 11, 12, 13, 14, 15, 16, 17, 18, 19, or 20, further comprising a first plurality of nanoribbons through the first gate and a second plurality of nanoribbons through the second gate.

Example 22 is a method comprising: providing a substrate; providing a first metal gate on the substrate; providing a second metal gate on the substrate, wherein the first metal gate and the second metal gate are in a first plane, and wherein a top surface of the first metal gate and a top surface of the second metal gate are in a second plane; and forming a plug between an edge of the first gate and an edge of the second gate, wherein the plug includes a cap, and wherein a top surface of the cap is in the second plane.

Example 23 includes the method of example 22, wherein the cap includes a selected one or more of: tungsten, aluminum, oxygen, and/or hafnium.

Example 24 includes the method of examples 22 or 23, wherein the plug further includes a liner that at least partially surrounds the cap, and wherein the liner includes a selected one or more of: silicon, oxygen, or nitrogen.

Example 25 includes the method of examples 22, 23, or 24, wherein the plug further includes a dielectric between the substrate and the cap.

What is claimed is:

1. A semiconductor device comprising:

a first gate with a top and a bottom;

a second gate with a top and a bottom, wherein a top of the first gate and a top of the second gate are in a plane; and a plug between the first gate and the second gate, wherein the plug includes a cap and a liner that at least partially surrounds the cap, wherein the liner separates the cap from the first gate and from the second gate.

2. The semiconductor device of claim 1, wherein a top of the cap is in the plane.

3. The semiconductor device of claim 2, wherein the cap is electrically isolated from the first gate and from the second gate.

4. The semiconductor device of claim 1, wherein the cap includes tungsten.

5. The semiconductor device of claim 1, wherein the liner includes a selected one or more of: silicon, oxygen, or nitrogen.

6. The semiconductor device of claim 1, wherein the plug further includes a base below the cap and the liner.

7. The semiconductor device of claim 6, wherein the base includes a dielectric.

8. The semiconductor device of claim 1, further including a first plurality of nanoribbons through the first gate and a second plurality of nanoribbons through the second gate.

9. The semiconductor device of claim 1, wherein the plug is formed into a gate cut in the semiconductor device.

10. The semiconductor device of claim 1, wherein the semiconductor device includes a selected one or more of: a finFET, a gate-all-around FET, or a forkFET.

11. A semiconductor device comprising:

a substrate;

a first gate on the substrate;

a second gate on the substrate, wherein a side of the first gate and a side of the second gate are in a first plane, and wherein a top of the first gate and a top of the second gate are in a second plane; and a plug between the first gate and the second gate, wherein a top of the plug is in the second plane, wherein the plug includes a cap, and a liner at least partially surrounding the cap, wherein a top of the cap is in the second plane.

12. The semiconductor device of claim 11, wherein a side of the plug is parallel to the first plane.

13. The semiconductor device of claim 11, wherein the plug is on the substrate.

14. The semiconductor device of claim 11, wherein the plug further includes a base between the substrate and the liner.

15. The semiconductor device of claim 14, wherein the base includes a dielectric.

16. The semiconductor device of claim 11, wherein the cap includes a selected one or more of: tungsten, aluminum, oxygen, and/or hafnium.

17. The semiconductor device of claim 11, wherein the cap is not electrically conductive.

18. The semiconductor device of claim 11, wherein the cap is electrically isolated from the first gate and from the second gate.

19. The semiconductor device of claim 11, wherein the liner includes a selected one or more of: silicon, oxygen, or nitrogen.

20. The semiconductor device of claim 11, further comprising a first plurality of nanoribbons through the first gate and a second plurality of nanoribbons through the second gate.

21. A method comprising:

providing a substrate;

providing a first metal gate on the substrate;

providing a second metal gate on the substrate, wherein the first metal gate and the second metal gate are in a first plane, and wherein a top surface of the first metal gate and a top surface of the second metal gate are in a second plane; and forming a plug between an edge of the first gate and an edge of the second gate, wherein the plug includes a cap, and a liner that at least partially surrounds the cap, wherein the liner separates the cap from the first metal gate and from the second metal gate, and wherein a top surface of the cap is in the second plane.

22. The method of claim 21, wherein the cap includes a selected one or more of: tungsten, aluminum, oxygen, and/or hafnium.

23. The method of claim 21 wherein the liner includes a selected one or more of: silicon, oxygen, or nitrogen.

24. The method of claim 21, wherein the plug further includes a dielectric between the substrate and the cap.

* * * * *